United States Patent
Ohtsu et al.

(10) Patent No.: US 7,162,127 B2
(45) Date of Patent: Jan. 9, 2007

(54) POLYMERIC OPTICAL WAVEGUIDE FILM, POLYMERIC OPTICAL WAVEGUIDE MODULE AND METHOD OF MANUFACTURING POLYMERIC OPTICAL WAVEGUIDE FILM

(75) Inventors: Shigemi Ohtsu, Kanagawa (JP); Keishi Shimizu, Kanagawa (JP); Kazutoshi Yatsuda, Kanagawa (JP); Eiichi Akutsu, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/992,117

(22) Filed: Nov. 19, 2004

(65) Prior Publication Data

US 2005/0286831 A1    Dec. 29, 2005

(30) Foreign Application Priority Data

Jun. 29, 2004    (JP)    ............... 2004-190984

(51) Int. Cl.
| G02B 6/12 | (2006.01) |
| G02B 6/26 | (2006.01) |
| G02B 6/42 | (2006.01) |
| G02B 6/30 | (2006.01) |
| G02B 6/36 | (2006.01) |
| G01J 1/42 | (2006.01) |

(52) U.S. Cl. ............... 385/49; 385/14; 385/27; 385/39; 385/88; 250/227.11
(58) Field of Classification Search ............ 385/49, 385/88; 250/227.11–32, 239
See application file for complete search history.

(56) References Cited

U.S. PATENT DOCUMENTS

| 5,771,322 A | * | 6/1998 | Matsumoto et al. ......... 385/31 |
| 5,999,670 A | * | 12/1999 | Yoshimura et al. ......... 385/31 |
| 6,322,736 B1 | * | 11/2001 | Bao et al. ................. 264/105 |
| 6,355,198 B1 | * | 3/2002 | Kim et al. ................. 264/259 |
| 6,396,082 B1 | * | 5/2002 | Fukasawa et al. ......... 257/79 |
| 6,912,334 B1 | * | 6/2005 | Koyama .................... 385/16 |
| 2004/0017977 A1 | * | 1/2004 | Lam et al. ................ 385/49 |
| 2004/0039122 A1 | * | 2/2004 | Morita et al. ............. 525/222 |

FOREIGN PATENT DOCUMENTS

| JP | 04-155627 | * | 5/1992 |
| JP | 2000-39530 | | 2/2000 |
| JP | 2000-39531 | | 2/2000 |
| JP | 2000-235127 | | 2/2000 |

(Continued)

*Primary Examiner*—Frank G. Font
*Assistant Examiner*—Charlie Peng
(74) *Attorney, Agent, or Firm*—Morgan, Lewis & Bockius, LLP

(57) ABSTRACT

A polymeric optical waveguide module has: a light-emitting element; a polymeric optical waveguide film having a lower clad, a core, an upper clad, an optical path changing mirror surface provided at one end of the polymeric optical waveguide film and a guided light leakage portion on at least one of a lower surface of the core and an upper surface of the lower clad; and a monitoring light-receiving element that monitors light emitted from the light-emitting element. The light-emitting element, the polymeric optical waveguide film and the monitoring light-receiving element are aligned with each other so that the light emitted from the light-emitting element is reflected by the optical path changing mirror surface to be guided through the core and part of the light emitted from the light-emitting element is received by the monitoring light-receiving element via the guided light leakage portion.

18 Claims, 9 Drawing Sheets

FOREIGN PATENT DOCUMENTS

| | | |
|---|---|---|
| JP | 2002-333538 | 11/2002 |
| JP | 2004-29507 | 1/2004 |
| JP | 2004-86144 | 3/2004 |
| JP | 2004-109927 | 4/2004 |

* cited by examiner

POLYMERIC OPTICAL WAVEGUIDE FILM, POLYMERIC OPTICAL WAVEGUIDE MODULE AND METHOD OF MANUFACTURING POLYMERIC OPTICAL WAVEGUIDE FILM

BACKGROUND OF THE INVENTION

1. Field of the Invention

The present invention relates to a polymeric optical waveguide module that is equipped with a light-emitting element, a monitoring light-receiving element and an optical waveguide, a polymeric optical waveguide film used for the module and a manufacturing method thereof.

2. Description of the Related Art

Among manufacturing methods of a polymeric optical waveguide are (1) a method in which a film is impregnated with a monomer, a core portion is changed in refractive index by exposing it to light selectively, and this film is bonded to another film (selective polymerization method), (2) a method in which after a core layer and a clad layer are applied a clad is formed by reactive ion etching (RIE method), (3) a method using photolithography in which an ultraviolet curable resin in which a photosensitive material is added to a polymer material is subjected to exposure and development (direct exposure method), (4) a method using injection molding, and (5) a method in which after a core layer and a clad layer are applied a core portion is exposed to light and its refractive index is changed (photobleaching method).

However, the selective polymerization method of item (1) has a problem in the film bonding and the methods of items (2) and (3) are costly because of the use of photolithography. The method of item (4) has a problem that the accuracy of the diameter of a core obtained is not sufficiently high, and the method of item (5) has a problem that a sufficiently large refractive index difference cannot be obtained between the core and the clad.

At present, only the methods of items (2) and (3) exhibit superior performance and hence are practical but they still have the cost problem. And none of the methods of items (1)–(5) can be applied to formation of a polymeric optical waveguide on a large-area, flexible plastic base material.

In contrast, the present inventors and other persons invented and filed patent applications of manufacturing methods of a polymeric optical waveguide using a mold (JP-A-2004-29507, JP-A-2004-86144, and JP-A-2004-109927), which are entirely different from the above conventional manufacturing methods of a polymeric optical waveguide. These methods make it possible to simply mass-produce a polymeric optical waveguide very simply at a low cost, and to manufacture a polymeric optical waveguide exhibiting a low guiding loss though they are simple methods. These methods make it possible to manufacture a polymeric optical waveguide having any pattern as long as a corresponding mold can be produced. Further, these methods enable manufacture of an optical waveguide on a flexible base material, which is impossible previously.

Incidentally, in recent years, optical wiring that is carried out between apparatus, between boards in an apparatus, or within a chip to increase the operation speed or the integration density has come to attract much attention, instead of high-density electric wiring, for example, in the IC and LSI technologies.

As devices for optical wiring is, for example, a device disclosed in JP-A-2000-39530 that is equipped with a light-emitting element and a light-receiving element that are arranged in the core/clad lamination direction of a polymeric optical waveguide having a core and a clad that surrounds the core, an incidence-side mirror for inputting light emitted from the light-emitting element to the core, and an exit-side mirror for outputting, to the light-receiving element, light that is output from the core. A recess is formed in the clad layer on each of the optical path between the light-emitting element and the incidence-side mirror and the optical path between the exit-side mirror and the light-receiving element, whereby light emitted from the light-emitting element and light reflected from the exit-side mirror are converged. JP-A-2000-39531 discloses an optical device in which light emitted from a light-emitting element is input to a core end face of a polymeric optical waveguide having a core and a clad that surrounds the core. The light incidence end face of the core is shaped so as to be convex toward the light-emitting element, whereby light emitted from the light-emitting element is converged and the guiding loss is thereby reduced.

Further, JP-A-2000-235127 discloses an optoelectronic integrated circuit in which a polymeric optical waveguide circuit is directly constructed on an optics/electronics-united circuit board in which electronic devices and optical devices are integrated.

If elements as mentioned above can be incorporated in an apparatus as parts of optical wiring, the degree of freedom in designing the structure of optical wiring can be increased, as a result of which compact and small light-emitting/receiving elements can be produced.

However, in methods so far proposed, costs required for mounting are a serious problem. That is, a mirror portion needs to be buried to form a 90° bending mirror and alignment needs to be performed with high accuracy also in bonding an optical waveguide to light-emitting/receiving elements.

The optical output power of laser elements such as a VCSEL varies depending on the external temperature, for example. To obtain a stable optical output power, feedback needs to be performed by monitoring the optical output power itself. In the case of waveguide-type optical modules, for example, various measures are taken such as setting a branch waveguide to take out part of the optical output power for monitoring. However, in the case of an element using multiple light-emitting points such as a 1×4 VCSEL array, it is difficult to dispose monitoring photodetectors (PDs) and to couple branch waveguides to the monitoring PDs. If monitoring PDs are disposed on the side surfaces of a waveguide film, parts of output light beams can easily be guided for monitoring by branching the waveguides that are coupled to the two outside light-emitting points. However, to branch the waveguides that are coupled to the two inside light-emitting points and take out light beams through the branch waveguides, the branch waveguides need to cross the outside waveguides. Although almost no crosstalk occurs if the crossing waveguides are perpendicular to each other, a problem remains that the outside waveguides suffer from certain guiding losses occurring at the crossing portions, as a result of which the output characteristics of the outside waveguides are made different from those of the inside waveguides. If monitoring PDs are gathered together into a 1×4 array and disposed outside to attain cost reduction, the number of crossing points of monitoring waveguides increases, which increases the loss and makes the problem worse that the output characteristics of arrayed waveguides are different from each other. The same problems occur when the number of VCSELs constituting an array is increased.

SUMMARY OF THE INVENTION

The present invention has been made in view of the above circumstances, and provides a polymeric optical waveguide module that does not require a complex structure, makes it possible to easily monitor the power of light emitted from a light-emitting element, and can be manufactured at a low cost, as well as a polymeric optical waveguide film that is used in such a polymeric optical waveguide module and manufacturing method of the film.

According to an aspect of the invention, a polymeric optical waveguide module includes: a light-emitting element; a polymeric optical waveguide film having a lower clad, a core, an upper clad, an optical path changing mirror surface provided at one end of the polymeric optical waveguide film and a guided light leakage portion on at least one of a lower surface of the core and an upper surface of the lower clad; and a monitoring light-receiving element that monitors light emitted from the light-emitting element. The light-emitting element, the polymeric optical waveguide film and the monitoring light-receiving element are aligned with each other so that the light emitted from the light-emitting element is reflected by the optical path changing mirror surface to be guided through the core and part of the light emitted from the light-emitting element is received by the monitoring light-receiving element via the guided light leakage portion.

BRIEF DESCRIPTION OF THE DRAWINGS

Embodiments of the present invention will be described in detail based on the following figures, wherein:

FIG. 1A illustrates an optical path changing surface and FIG. 1B illustrates an optical path changing surface and an alignment surface;

FIG. 2A is a plan view and FIG. 2B is a IIB—IIB sectional view;

DETAILED DESCRIPTION OF THE INVENTION

A polymeric optical waveguide module according to the embodiments of the invention (may be hereinafter referred to simply as "optical waveguide module" or "module") is equipped with a light-emitting element, a polymeric optical waveguide film, and a monitoring light-receiving element for monitoring light that is emitted from the light-emitting element, and is characterized in that the polymeric optical waveguide film has a lower clad, a core(s), and an upper clad and has an optical path changing mirror surface at one end and that a guided light leakage portion is provided in a core lower surface and/or the upper surface of the lower clad. Since the polymeric optical waveguide film has the optical path changing mirror surface at the one end, light emitted from the light-emitting element that is aligned with the mirror surface is changed in the optical path by the mirror surface and then guided through the waveguide. Since the polymeric optical waveguide film also has the guided light leakage portion, part of the guided light leaks out through the clad (lower clad) and enters the light-receiving point of the monitoring light-receiving element that is aligned with the guided light leakage portion. The light emitted from the light-emitting element is thus monitored.

The term "lower clad" means a clad that is located on the side of the monitoring light-receiving element of the polymeric optical waveguide module.

First, the polymeric optical waveguide film will be described.

The optical path changing surface of the polymeric optical waveguide film may be a surface capable of introducing light emitted from the light-emitting element into the core of the polymeric optical waveguide film. To change the direction of light by 90°, for example, a 45° mirror surface is used as the optical path changing surface.

In the polymeric optical waveguide film used in the invention, it is effective to form an alignment surface for alignment between the light-emitting element and the optical path changing surface at the same end as the optical path changing surface is formed. In mounting the polymeric optical waveguide film to form a module, the alignment surface facilitates aligning the light-emitting point of the light-emitting element and the optical path changing surface with respect to each other so that light emitted from the light-emitting element is changed in the optical path by the optical path changing surface and then guided through the optical waveguide.

There are no limitations on the alignment surface as long as it has the above function. For example, the alignment surface may be a mating surface or an alignment mark. In particular, the mating surface is effective in facilitating the alignment. The mating surface may have any angle with respect to the surfaces of the polymeric optical waveguide film. However, a vertical mating surface is advantageous in facilitating the alignment and working for forming it.

Figure 1A:
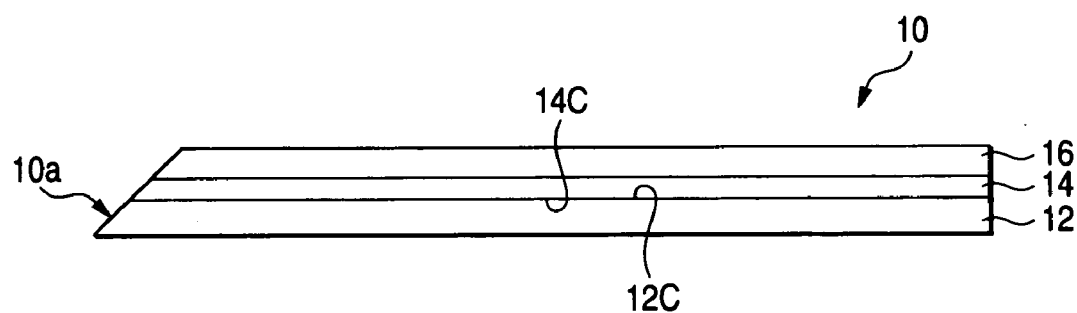
FIGS. 1A and 1B show longitudinal cross sections of polymeric optical waveguide films used in a polymeric optical waveguide module according to an embodiment of the invention.

FIG. 1A shows an exemplary polymeric optical waveguide film that is incorporated in a polymeric optical waveguide module according to an embodiment of the invention. In FIG. 1A, reference symbol 10 denotes a polymeric optical waveguide film; 12, a lower clad; 12C, the upper surface of the lower clad 12; 14, a core; 14C, a core lower surface; 16, an upper clad; and 10a, a 45° mirror surface as an optical path changing surface. The optical path of light that is emitted from a light-emitting element is changed by 90° by the 45° mirror surface.

Figure 1B:
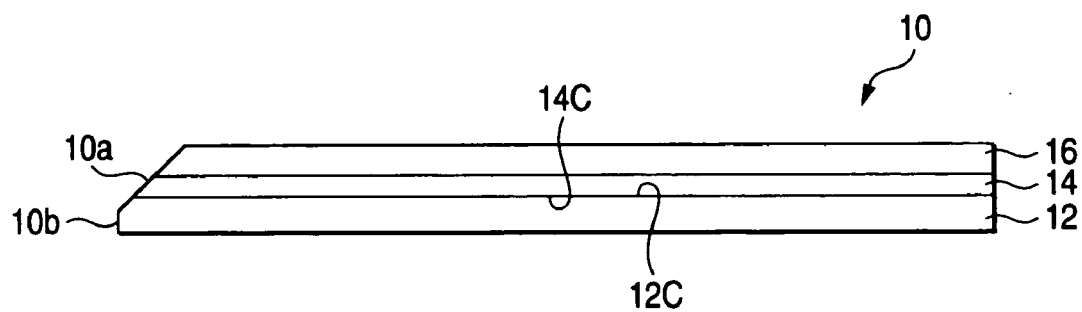

FIG. 1B shows another form of polymeric optical waveguide film used in the embodiment of the invention in which an optical path changing surface 10a and an alignment surface 10b are formed at the same end. Members and surfaces having the same ones in the polymeric optical waveguide film of FIG. 1A are given the same reference symbols as the latter. In FIG. 1B, reference symbol 10a denotes a 45° mirror surface and symbol 10b denotes a vertical surface used as a mating surface for aligning. It is necessary that this vertical surface be formed so as not to reach the cores.

Although not provided with a mating surface, the polymeric optical waveguide film 10 of FIG. 1A can be aligned with a light-emitting element without causing any problems.

Next, a guided light leakage portion of the polymeric optical waveguide film will be described. The guided light leakage portion is provided in a core lower surface(s) and/or the upper surface of the lower clad so that part of guided light leaks out through the lower clad. An exemplary guided light leakage portion that can be provided easily is an optical defect portion. Examples of the optical defect portion are bubbles, a cut, and minute asperities, among which the cut and the minute asperities are preferable because they can be formed easily with a dicing saw.

The optical defect portion can be formed in manufacture (described later) of a polymeric optical waveguide film, for example, at a prescribed position, in a clad film base which forms cores thereon or in a core surface after formation of cores.

In the embodiment of the invention, a planar light-emitting element is used favorably as the light-emitting element because it is joined (bonded) to one end of a polymeric optical waveguide film. Examples of the planar light-emitting element are VCSELs and LEDs.

A surface light-receiving element is used favorably as the monitoring light-receiving element because it is joined (bonded) to the lower clad of a polymeric optical waveguide film. An example of the surface light-receiving element is a photodetector(s) (PD). The monitoring light-receiving element (hereinafter may be abbreviated as "light-receiving element") may be either one that monitors light coming from a single light-emitting point or one that monitors light beams coming from all light-emitting points; choice may be made between them as appropriate according to a situation.

To assemble the polymeric optical waveguide film, the light-emitting element, and the monitoring light-receiving element into a polymeric optical waveguide module, it is preferable to hold those on a submount. More specifically, it is preferable to use a submount having a recess for holding the polymeric optical waveguide film and through-holes for holding the light-emitting element and the light-receiving element.

Where the polymeric optical waveguide film is in the form of FIG. 1B, the light-emitting element and the optical path changing surface can be easily aligned with each other by using a submount that is formed with an alignment surface corresponding to an alignment surface that is formed in the polymeric optical waveguide film and performing alignment by using those alignment surfaces. For example, where the polymeric optical waveguide film is formed with a mating surface (mentioned above) at one end, alignment can easily be performed by also providing a mating surface in a module component and making those surfaces flush with each other.

Next, one form of polymeric optical waveguide module will be described that uses the polymeric optical waveguide film of FIG. 1A and has a light-receiving element for monitoring light coming from a single light-emitting point.

Figure 2A:
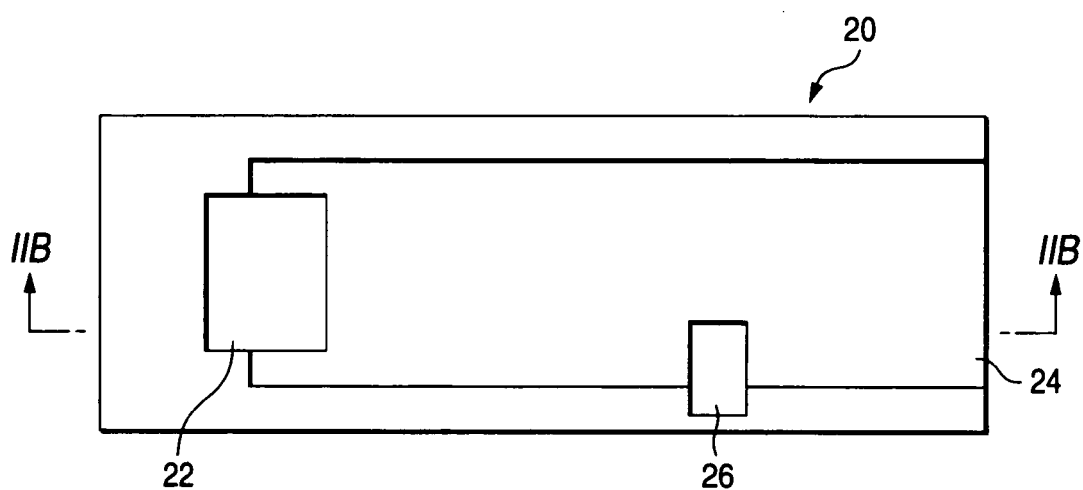
FIGS. 2A and 2B show exemplary submount used in a polymeric optical waveguide module.
Figure 2B:
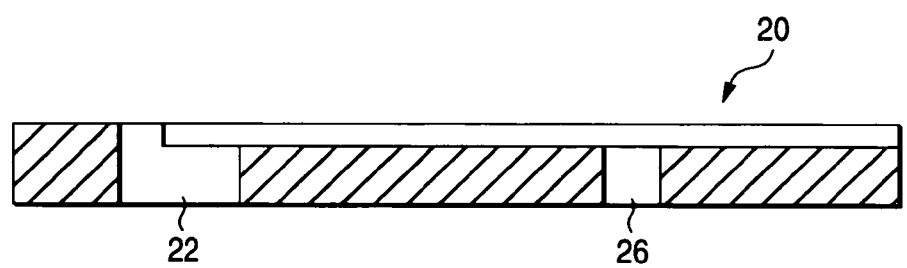

First, a submount will be described with reference to FIGS. 2A and 2B. FIG. 2A is a plan view of a submount and FIG. 2B is a sectional view taken along line IIB—IIB in FIG. 2A. In FIGS. 2A and 2B, reference numeral 22 denotes a through-hole for holding a light-emitting element; 26, a through-hole for holding a monitoring light-receiving element; and 24, a recess for holding a polymeric optical waveguide film. It is appropriate that the recess 24 be deep enough to hold the polymeric optical waveguide film.

Next, a polymeric optical waveguide module using the above submount will be described with reference to FIGS. 3 and 4A–4D.

Figure 3:
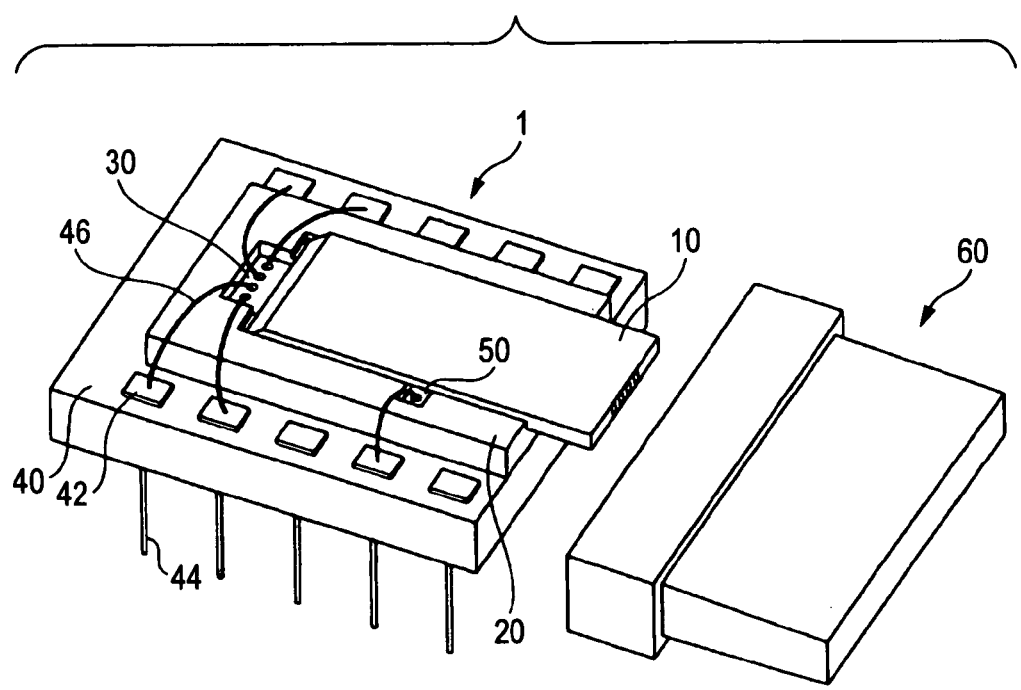
FIG. 3 is a perspective view of a polymeric optical waveguide module according to another embodiment of the invention.

FIG. 3 is a perspective view of a polymeric optical waveguide module according to another embodiment of the invention. In FIG. 3, reference numeral 1 denotes a polymeric optical waveguide module; 10, a polymeric optical waveguide film; and 20, a submount. The submount 20 holds the polymeric optical waveguide film 10, a light-emitting element 30, and a light-receiving element 50. Reference numeral 40 denotes an IC package having electrodes 42 and electrode pins 44. The electrodes 42 are connected to the light-emitting element 30 or the light-receiving element 50 via interconnections 46. Reference numeral 60 denotes an optical connector.

Figure 4A:
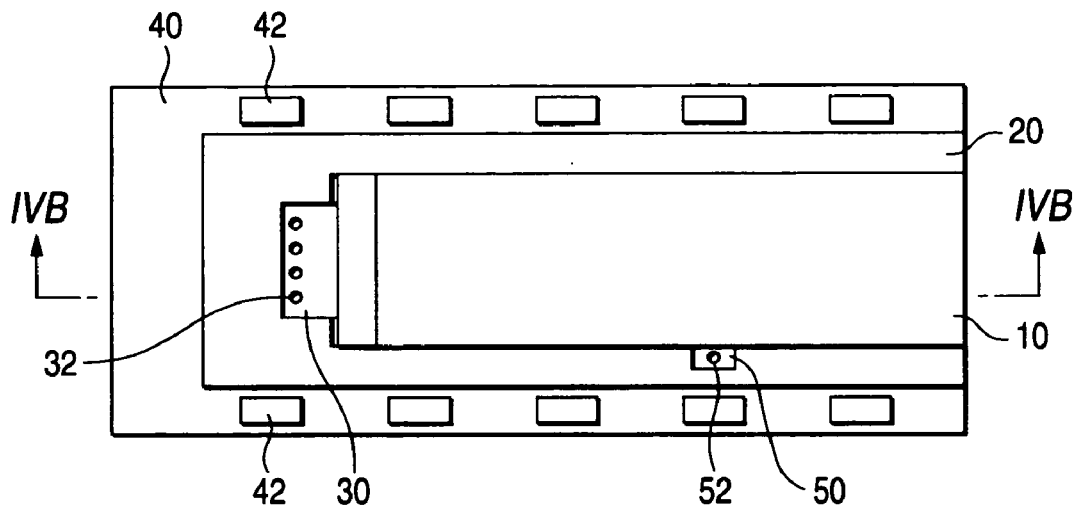
FIGS. 4A and 4B are a plan view and a IVB—IVB sectional view, respectively, of the polymeric optical waveguide module of FIG. 3.
Figure 4B:
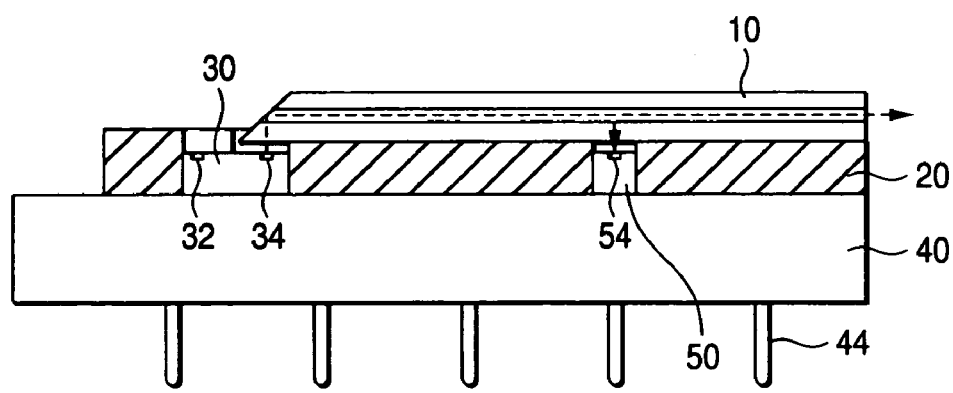
Figure 4C:
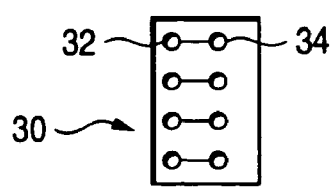
FIG. 4C is a plan view of a light-emitting element of the polymeric optical waveguide module of FIG. 3.
Figure 4D:
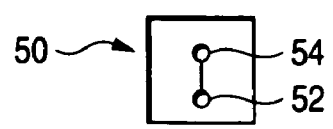
FIG. 4D is a plan view of a light-receiving element of the polymeric optical waveguide module of FIG. 3.

FIGS. 4A and 4B are a plan view and a IVB—IVB sectional view, respectively, of the polymeric optical waveguide module 1 of FIG. 3 (the interconnections 46 shown in FIG. 3 are omitted). FIG. 4C is a conceptual view showing electrodes and light-emitting points of the light-emitting element 30. FIG. 4D is a conceptual view showing an electrode and a light-receiving point of the light-receiving element 50.

In FIG. 4A, reference numeral 32 denotes electrodes of the light-emitting element 30 and numeral 52 denotes an electrode (connected to the corresponding electrode 42 via the interconnection 46) of the light-receiving element 50. In FIG. 4B, reference numeral 34 denotes light-emitting points of the light-emitting element 30 and numeral 54 denotes a light-receiving point of the light-receiving element 50. A broken line indicates an optical path.

As shown in FIG. 4B, the light-emitting points 34 and the 45° mirror surface that is formed at the one end of the polymeric optical waveguide film 10 are aligned with each other so that light beams emitted from the light-emitting points 34 are changed in the optical paths by the 45° mirror surface and then guided through the cores. This alignment can be performed with a visual observation without any difficulties. Light beams emitted from the light-emitting points 34 are changed in the optical paths by the 45° mirror surface, guided through the cores, and output from the other end of the polymeric optical waveguide film 10.

As a result of the above alignment, the light-receiving point 54 of the light-receiving element 50 and the guided light leakage portion (not shown) that is provided at a prescribed position in a core and/or the lower clad of the polymeric optical waveguide film 10 are aligned with each other so that part of light being guided through the core concerned leaks out through the guided light leakage portion and is received by the light-receiving point 54. Therefore, part of light being guided through the core concerned leaks out through the guided light leakage portion, is received by the light-receiving point 54 of the light-receiving element 50, and is subjected to monitoring.

The light output end of the polymeric optical waveguide film 10 can be connected to an optical connector 60 (e.g., MT connector).

In FIG. 4C, reference numeral 30 denotes the light-emitting element, numeral 32 denotes the electrodes, and numeral 34 denotes the light-emitting points. In FIG. 4D, reference numeral 50 denotes the light-receiving element, numeral 52 denotes the electrode and numeral 54 denotes the light-receiving point.

Next, a polymeric optical waveguide module according to another embodiment of the invention will be described. This polymeric optical waveguide module is such that a polymeric optical waveguide film as shown in FIG. 1B that is provided with an optical path changing mirror surface and an alignment surface at one end is held by a submount that is formed with an alignment surface, and that a light-receiving element is provided having four light-receiving points that correspond to four respective cores of the polymeric optical waveguide film.

Figure 5A:
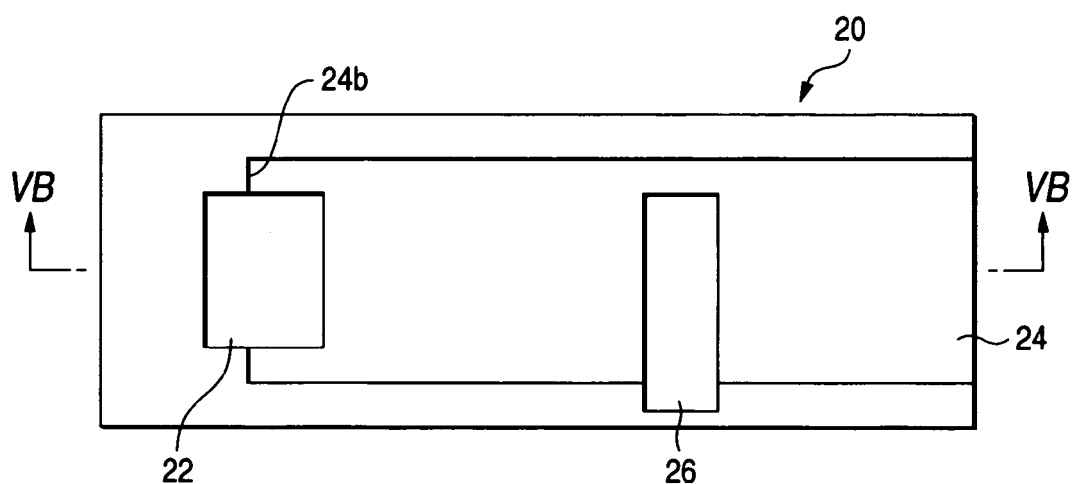
FIGS. 5A and 5B are a plan view and a VB—VB sectional view, respectively, of a submount that is used a polymeric optical waveguide module according to another embodiment of the invention.
Figure 5B:
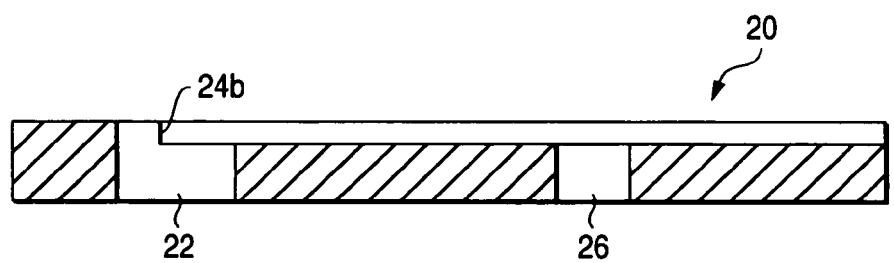

FIGS. 5A and 5B are a plan view and a VB—VB sectional view, respectively, showing the submount having the alignment surface that is used in the above polymeric optical waveguide module.

In FIGS. 5A and 5B, reference numeral 22 denotes a through-hole for holding a light-emitting element; 26, a through-hole for holding a monitoring light-receiving element; and 24, a recess for holding a polymeric optical waveguide film. Reference symbol 24b denotes a vertical alignment surface (mating surface) that is provided so as to correspond to the alignment surface 10b (vertical mating surface) that is provided in the polymeric optical waveguide film at one end (see FIG. 1B).

Figure 6:
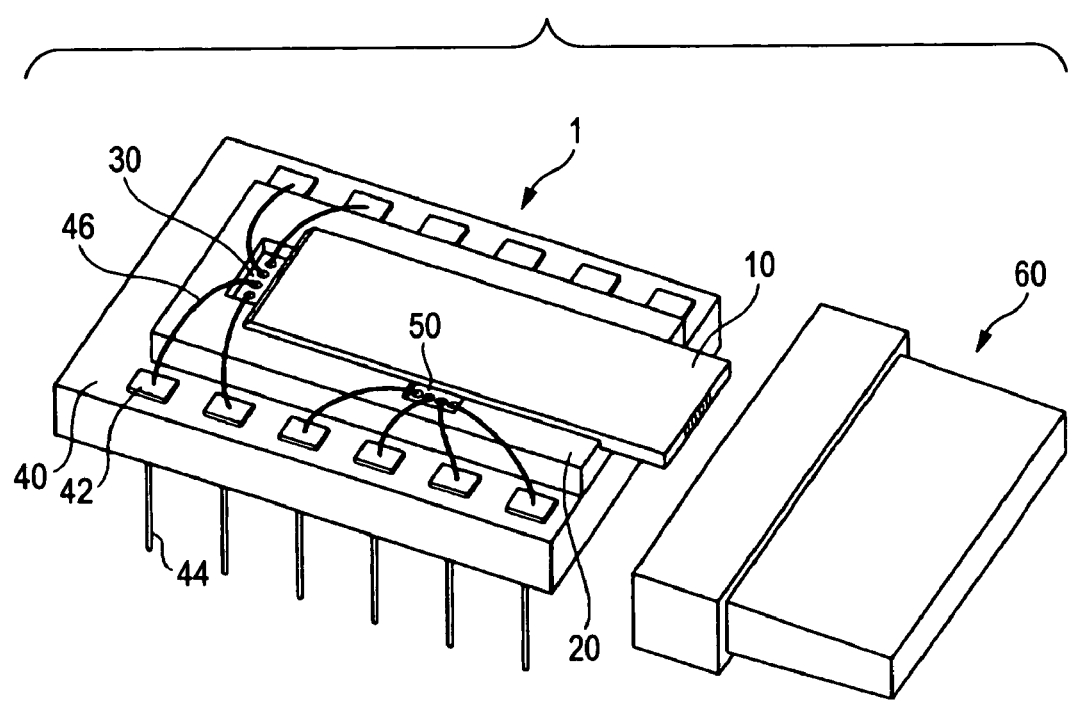
FIG. 6 is a perspective view of a polymeric optical waveguide module using the submount of FIGS. 5A and 5B.

FIG. 6 is a perspective view of a polymeric optical waveguide module in which a light-emitting element, a polymeric optical waveguide film, and a light-receiving element are held by the above submount and the submount is mounted on an IC package. Members in FIG. 6 having the same members in FIG. 3 are given the same reference numerals as the latter.

Figure 7A:
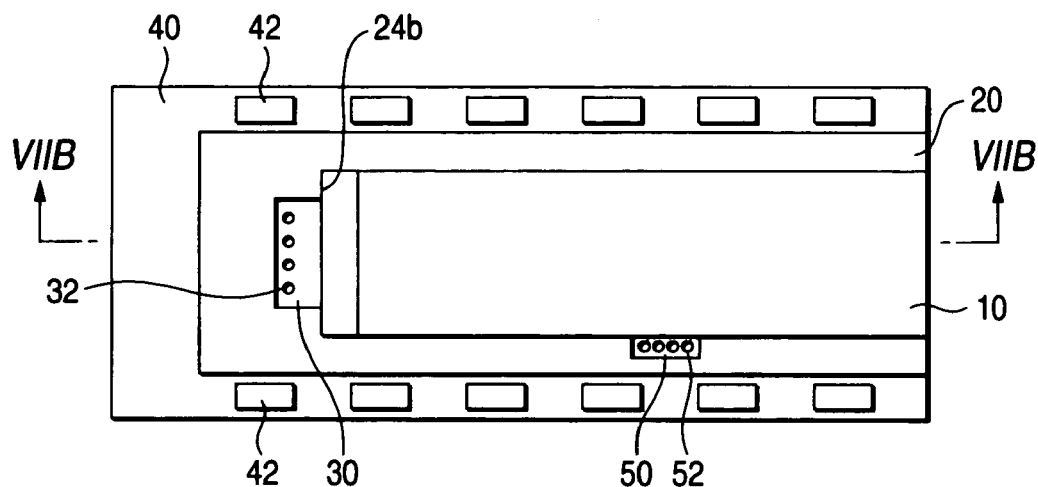
FIGS. 7A and 7B are a plan view and a VIIB—VIIB sectional view, respectively, of the polymeric optical waveguide module of FIG. 6.
Figure 7B:
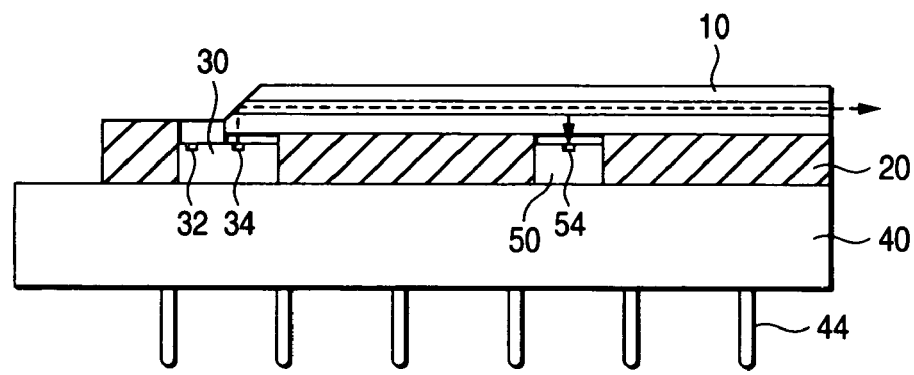
Figure 7C:
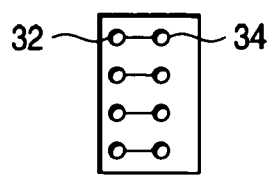
FIG. 7C is a plan view of a light-emitting element of the polymeric optical waveguide module of FIG. 6.
Figure 7D:
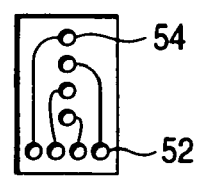
FIG. 7D is a plan view of a light-receiving element of the polymeric optical waveguide module of FIG. 6.

FIGS. 7A and 7B are a plan view and a VIIB—VIIB sectional view, respectively, of the polymeric optical waveguide module of FIG. 6 (the interconnections 46 shown in FIG. 6 are omitted). FIG. 7C is a conceptual view showing electrodes 32 and light-emitting points 34 of the light-emitting element 30. FIG. 7D is a conceptual view showing electrodes 52 and light-receiving points 54 of the light-receiving element 50.

In FIG. 7A, reference numeral 32 denotes electrodes of the light-emitting element 30 and numeral 52 denotes electrodes (connected to the corresponding electrodes 42 via the interconnection 46) of the light-receiving element 50. In FIG. 7B, reference numeral 34 denotes light-emitting points of the light-emitting element 30 and numeral 54 denotes light-receiving points of the light-receiving element 50. A broken line indicates an optical path. Having the four light-receiving points 54, the light-receiving element 50 of this polymeric optical waveguide module receives light beams from the four cores of the polymeric optical waveguide film 10 and thereby serves for monitoring. The four electrodes 52 are wired to the corresponding electrodes 42 of the IC package 40.

The mating surface 24b shown in FIG. 7A are formed at such a position that in a state that the vertical alignment surface of the polymeric optical waveguide film 10 has been mated lightly to the mating surface 24b light beams emitted from the light-emitting points 34 of the light-emitting element 30 are changed in the optical paths by 90° by the optical path changing surface (45° mirror surface) and then guided through the cores.

As shown in FIGS. 7A and 7B, the light-emitting element 30 and the light-receiving element 50 are inserted into the through-holes 22 and 26 of the submount 20, respectively. Then, the vertical mating surface 10b that is located at the one end of the polymeric optical waveguide film 10 is lightly mated to the vertical mating surface 24b of the recess 24 of the submount 20, whereby the light-emitting points 34 of the light-emitting element 30 and the 45° mirror surface of the polymeric optical waveguide film 10 are aligned with each other. As a result of this alignment, the guided light leakage portions and the light-receiving points 54 are aligned with each other so that parts of guided light beams being guided through the cores leak through the guided light leakage portions that are provided at prescribed positions (four positions) of the polymeric optical waveguide film 10 and are received by the four light-receiving points 54 of the light-receiving element 50, respectively.

Light beams emitted from the respective light-emitting points 34 are changed in the optical paths by the 45° mirror surface, guided by the respective cores, and output from the other ends of the cores. Parts of the light beams leak through the respective guided light leakage portions and are received by the respective light-receiving points 54 of the light-receiving element 50 so as to be used for monitoring.

The light output end of the polymeric optical waveguide film 10 can be connected to an optical connector 60 (e.g., MT connector).

A surface light-emitting element (e.g., VCSELs of Fuji Xerox Co., Ltd.) is used as the light-emitting element 30, and any of various photodiodes such as GaAs and Si photodiodes is used as the light-receiving element 50. There are no other limitations on the types of the light-emitting element 30 and the light-receiving element 50.

In connection with the above two forms of polymeric optical waveguide modules, the light output end of the polymeric optical waveguide film 10 may extend past the corresponding end of the submount 20 (see FIGS. 3 and 6), be flush with the latter, or be located inside the latter.

Figure 8:
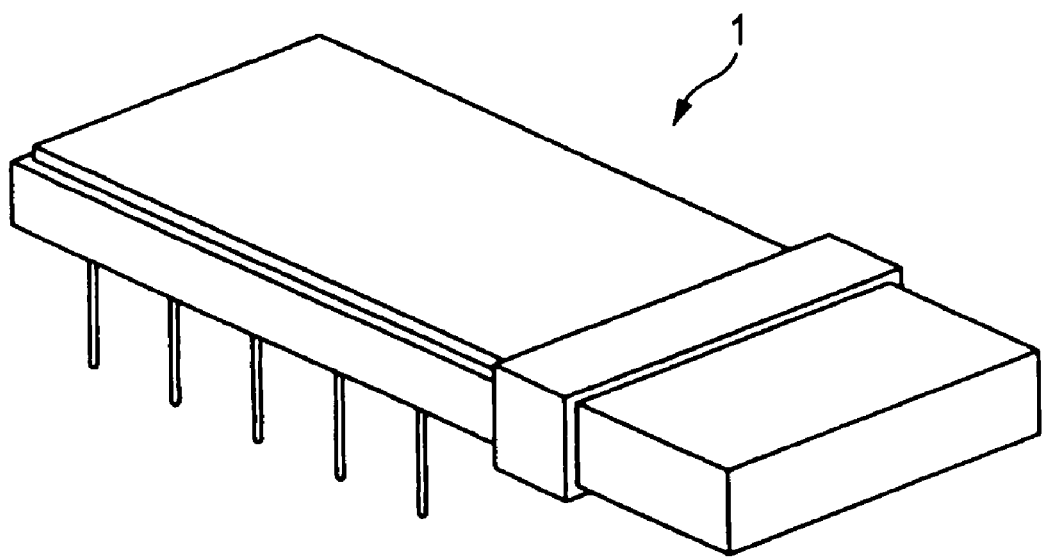
FIG. 8 illustrates a polymeric optical waveguide module that is covered with a cover and connected to an optical connector.

FIG. 8 shows a polymeric optical waveguide module in which the light-emitting element, the polymeric optical waveguide film, the electrodes, etc. are covered with a cover. The light output end of this form of polymeric optical waveguide module is connected to an optical connector.

A submount is manufactured by forming through-holes for holding a light-emitting element and a light-receiving element and a recess for holding a polymeric optical waveguide film in a substrate such as a Si substrate or a glass substrate. There are no limitations of the methods for forming the through-holes and the recess; for example, they are formed by RIE (reactive ion etching). In the submount 20 of the form shown in FIG. 3, the ends are formed by dicing.

A light-receiving/emitting element module according to the invention can be assembled merely by fitting a light-emitting element or a light-receiving element and a polymeric optical waveguide film into prescribed worked portions (a through-hole or a recess) of a module component such as a submount.

The submount and the light-emitting element or light-receiving element inserted in the through-hole are bonded to an IC package. A solder material or an adhesive (e.g., epoxy resin) is used for the bonding, and a proper material is selected taking the heat resistance and the electrical conductivity into consideration.

It is preferable that the polymeric optical waveguide film be fixed to the recess of the submount with an adhesive. Examples of the adhesive are a curable resin that is used for manufacturing a polymeric optical waveguide film, a thermosetting adhesive, and an ultraviolet curable adhesive. Where a gap exists between the polymeric optical waveguide film and the light-emitting element or the light-receiving element, it is preferable that the gap be filled with such a resin or an adhesive. It is preferable that the volume shrinkage factor of the adhesive be less than or equal to 10%.

The submount that is used in assembling the light-receiving/emitting element module is manufactured as follows. A recess in which to place VCSELs or a PD(s) is formed in a Si or glass substrate by RIE. And an optical waveguide attachment portion that is designed in advance so that light beams emitted from the VCSELs enter cores via a 45° mirror surface of the polymeric optical waveguide or a light beam (s) that is output from a core(s) enters the PD is formed in the Si or glass substrate.

The VCSELs, the PD(s), and the optical waveguide are attached to a package via the submount, whereby a polymeric optical waveguide with a light-receiving element and a light-emitting element can be manufactured.

It is preferable that the polymeric optical waveguide film used in the invention be basically manufactured by the following process, for example. Formation of the guided light leakage portion will be described later as separate steps.

1) Step of preparing a mold that is formed by a cured layer of a curable resin for forming a mold and is formed with recesses corresponding to optical waveguide core projections and two or more through-holes that communicate with the respective ends of each recess.

2) Step of bringing a clad film base material that exhibits good adhesion to the mold into close contact with the mold.

3) Step of filling the recesses of the mold with a core formation curable resin by filling, with the core formation curable resin, the through-hole located at one end of each recess of the mold with which the clad film base material is in close contact and then performing vacuum suction of the core formation curable resin from the side of the through-hole located at the other end of each recess of the mold.

4) Step of curing the core formation curable resin that fills the recesses and peeling the mold off the clad film base material.

5) Step of forming a clad layer on the flexible clad film base material on which the cores are formed.

Figure 9A:
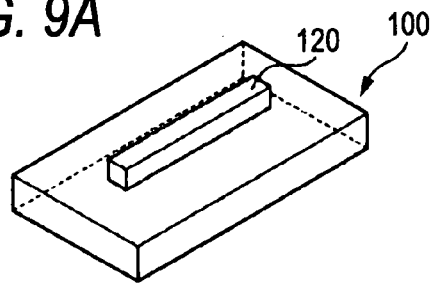
FIGS. 9A–9G illustrate a manufacturing process of a polymeric optical waveguide film that is used in the module.
Figure 9B:
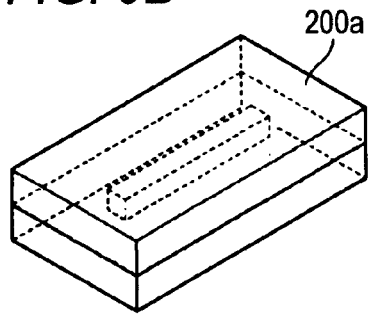
Figure 9C:
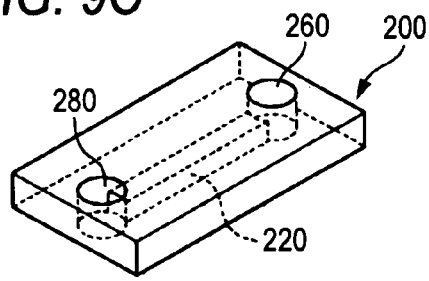

The whole of the above-described manufacturing process of a polymeric optical waveguide film will be described with reference to FIGS. 9A–9G To simplify the description, the following description will be directed to a case that only a single optical waveguide core is provided. FIG. 9A shows an original plate 100, and reference numeral 120 denotes a projection corresponding to an optical waveguide core. A mold formation curable resin is applied to or is cast on the surface, formed with the projection, of the original plate 100 and is then cured (see FIG. 9B). In FIG. 9B, reference symbol 200a denotes a cured resin layer. The cured resin layer 200a is peeled off and then the cured resin layer 200a having a recess is obtained (not shown). Through-holes 260 and 280 are formed at both ends of the recess 220 in the cured resin layer 200a by punching, for example, so as to communicate with the recess 220, whereby a mold 200 is obtained (see FIG. 9C).

Figure 9D:
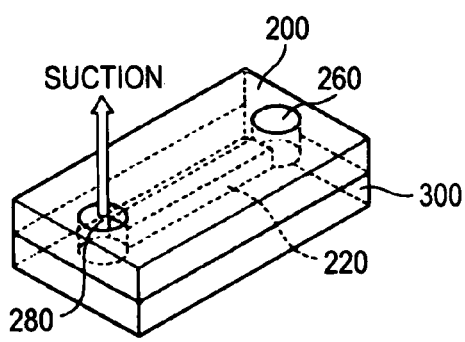
Figure 9E:
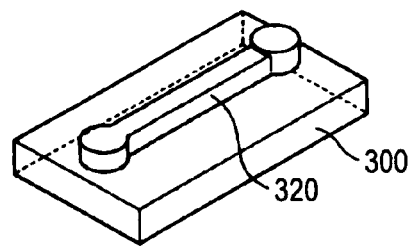

Then, as shown in FIG. 9D, a clad film base material 300 is brought into close contact with the mold. A core formation curable resin is put into the through-hole 260 of the mold 200 and is low-pressure sucked from the side of the other through-hole 280, whereby the recess 220 of the mold 200 is filled with the core formation curable resin. The core formation curable resin is cured and peeled off the mold 200, whereby an optical waveguide core 320 is formed on the clad film base material 300 (see FIG. 9E).

Figure 9F:
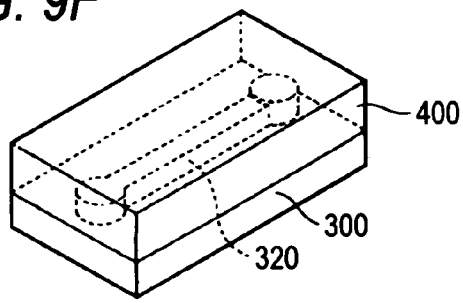
Figure 9G:
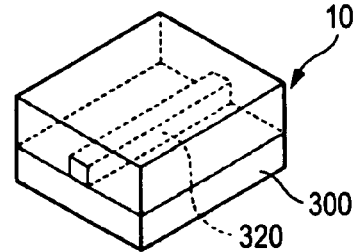

Then, a clad layer (upper clad layer) 400 is formed (see FIG. 9F). Finally, the cured resin portions in the through-holes 260 and 280 are cut away with a dicer, for example, whereby a polymeric optical waveguide film 10 is obtained (see FIG. 9G).

Next, the steps will be described individually.

1) Step of preparing a mold that is formed by a cured layer of a mold formation curable resin and is formed with recesses corresponding to optical waveguide core projections and two or more through-holes that communicate with the respective ends of each recess.

It is preferable that a mold be manufactured by using an original plate having projections that correspond to respective optical waveguide cores. However, the invention is not limited to such a case. A method using such an original plate will be described.

An original plate having projections corresponding to optical waveguide cores may be manufactured by a conventional method such as a photolithography method without any limitations or may be manufactured by a method of manufacturing a polymeric optical waveguide by electrodeposition or opto-electrodeposition (JP-A-2002-333538, filed by the present applicant). The size of the projections that are formed in the original plate and correspond to optical waveguide cores is determined as appropriate in accordance with purposes etc. of the polymeric optical waveguide. In general, approximately 10-μm-square cores are used in the case of a single-mode optical waveguide and 50-to-100-μm-square cores are used in the case of a multimode optical waveguide. For certain purposes, an optical waveguide having even larger cores is used whose sides measure several hundred micrometers.

An exemplary method of manufacture of a mold is as follows. A layer of a mold formation curable resin is formed by, for example, applying the mold formation curable resin to or casting it on the surface, formed with the projections, of the thus-manufactured original plate. The mold formation curable resin layer is cured after drying it if necessary, and a cured resin layer is peeled off the original plate to become a mold having recesses corresponding to the projections. Through-holes are formed through the mold so as to communicate with both ends of each recess. For example, through-holes having prescribed shapes are punched out in the mold. Even with punched-out through-holes, good adhesion is attained between the mold and a clad film base material and no gap is formed in between except the recesses of the mold: there is no fear that a core formation curable resin leaks from the recesses into a gap.

The thickness of the mold (cured resin layer) is determined as appropriate taking the ease of handling into consideration. In general, a proper thickness range is 0.1 to 50 mm.

It is desirable that the original plate be subjected in advance to release treatment such as application of a mold release agent to facilitate peeling of the mold from the original plate.

The through-holes provided on the core formation curable resin input side have a function of liquid (core formation curable resin) reservoirs. The through-holes provided on the core formation curable resin ejection side are used for vacuum suction, that is, for reducing the pressure in the recesses of the mold in filling the recesses with the resin. There are no limitations on the size and the shape of the resin-input-side through-holes except that they should communicate with the ends of the recesses, respectively, and have the function of liquid reservoirs. There are no limitations on the size and the shape of the resin-ejection-side through-holes except that they should communicate with the resin-ejection-side ends of the recesses, respectively, and be able to serve for vacuum suction.

The through-holes provided on the core formation curable resin input side of the recesses of the mold have the function of liquid reservoirs. Therefore, if those through-holes are shaped in such a manner that in a state that the mold is in close contact with the clad film base material the cross section of the through-holes decreases as the position goes away from the base material, the mold can be peeled off the base material after the core formation curable resin is put into the recesses and cured. The through-holes provided on the core formation curable resin ejection side need not have such a sectional structure because they need not have the function of liquid reservoirs.

Another exemplary method of manufacture of a mold is as follows. Not only projections corresponding to optical waveguide cores but also projections (their height should be greater than the thickness of a cured layer of a mold formation curable resin) for formation of through-holes are provided in an original plate. A layer of a mold formation curable resin is formed by, for example, applying the mold formation curable resin to the original plate so that the projections for formation of through-holes project from the resin layer. Then, the resin layer is cured and the cured resin layer is peeled off the original plate.

It is preferable that the mold formation curable resin that is used for the manufacture of a mold allow a resulting cured resin layer to be easily peeled off the original plate, form a mold (used repeatedly) that is higher than certain levels in mechanical strength and dimensional stability, be hard enough to maintain the recess shapes, and attain good adhesion to the clad film base material. If necessary, various additives may be added to the mold formation curable resin.

The mold formation curable resin should be able to be, for example, applied to or cast on the surface of the original plate and to correctly copy the projections that are formed in the original plate and correspond to respective optical waveguide cores. Therefore, it is preferable that the viscosity of the mold formation curable resin be lower than a certain limit, for example, be in a range of 500 to 7,000 mPa·s. (The mold formation curable resin used in the invention includes one that becomes an elastic rubber-like body when cured). To adjust the viscosity, a solvent may be added by such an amount as not to cause adverse effects.

From the viewpoints of the releasability, mechanical strength, dimensional stability, hardness, and adhesion to the clad film base material, curable organopolysiloxane may be used that becomes silicone rubber (silicone elastomer) or a silicone resin when cured. The curable organopolysiloxane may contain a methylsiloxane group, ethylsiloxane group, or a phenylsiloxane group in the molecule. Further, the curable organopolysiloxane may be either of a one-liquid type or a two-liquid type in which it is used in combination with a hardener, may be either of a thermosetting type or a room temperature setting type (cured by moisture in the air), and may also be other types (e.g., ultraviolet curable type).

The curable organopolysiloxane of a type that becomes silicone rubber when cured may be used. A resin usually called "liquid silicone rubber" (the term "liquid" is intended to cover ones having high viscosity such as paste-like ones), preferably a two-liquid type in which it is used in combination with a hardener, is used. Among these, addition-type liquid silicone rubber is preferable because it is cured uniformly (both of a surface portion and an inside portion) in a short time, no or a few by-products are formed when it is cured, and it is high in releasability and has a small shrinkage.

Liquid dimethylsiloxane rubber is preferable to the other kinds of liquid silicone rubber in terms of the adhesion, releasability, strength, and hardness. In general, a cured resin of the liquid dimethylsiloxane rubber has as small a refractive index as about 1.43. Therefore, a mold made of this material can be used as a clad layer as it is, that is, without peeling it off a clad film base material. In this event, some measures are needed to prevent a core formation resin that fills the mold and the clad film base material from peeling off the mold.

It is preferable that the viscosity of the liquid silicone rubber be in a range of 500 to 7,000 mPa·s because it is necessary to correctly copy the projections corresponding to optical waveguide cores, to decrease the number of mixed bubbles and facilitate air release, and to form a several-millimeter-thick mold. It is even preferable that the viscosity of the liquid silicone rubber be in a range of 2,000 to 5,000 mPa·s.

From the viewpoint of the adhesion to the base material film, it is preferable that the surface energy of the mold be in a range of 10 to 30 dyn/cm (even preferably, 15 to 24 dyn/cm).

From the viewpoints of the casting performance, the maintenance of recess shapes, and the releasability, it is preferable that the shore hardness of the mold be in a range of 15 to 80 (even preferably, 20 to 60).

From the viewpoint of the casting performance, it is preferable that the surface roughness (root mean square (RMS) roughness) of the mold be lower than or equal to 0.2 µm (even preferably, lower than or equal to 0.1 µm).

It is preferable that the mold be transparent in the ultraviolet and/or visible range. The reasons why it is preferable that the mold be transparent in the visible range are that alignment can be performed easily when the mold is brought into close contact with a clad film base material in the following step 2) and that an operation that the recesses of the mold are filled with a core formation curable resin in the following step 3) can be observed and hence completion of the filling can be recognized easily. The reason why it is preferable that the mold be transparent in the ultraviolet range is to enable ultraviolet curing through the mold in the case where an ultraviolet curable resin is used as the core formation curable resin. It is preferable that the transmittance of the mold in the ultraviolet range (250 to 400 nm) be higher than or equal to 80%.

The curable organopolysiloxane, in particular, the liquid silicone rubber that becomes silicone rubber when cured, is superior in the releasability and the adhesion to a clad film base material that are contrary characteristics and has an ability to copy a nano-structure. In a state that silicone rubber and a clad film base material are in close contact with each other, entrance of a liquid into a gap between them can be prevented. Capable of copying the original plate with high accuracy and attaining good adhesion to a clad film base member, a mold made of such silicone rubber makes it possible to efficiently fill only the recesses formed between the mold and the clad film base material with a core formation resin and facilitates peeling of the mold from the clad film base material. As such, the mold makes it possible to easily manufacture a polymeric optical waveguide that is shaped with high accuracy.

2) Step of bringing a clad film base material that exhibits good adhesion to the mold into close contact with the mold.

Optical devices using polymeric optical waveguides according to the invention are used for optical wiring in various levels. Therefore, the material of the clad film base material is selected in accordance with the use of the optical device taking into consideration the optical characteristics such as the refractive index and the transmittance, the mechanical strength, the heat resistance, the adhesion to the mold, the flexibility, etc. Examples of the clad film base material are an alicyclic acrylic resin film, an alicyclic olefin resin film, a cellulose triacetate film, and a fluororesin film. To secure a sufficient difference in refractive index from the cores, it is preferable that the refractive index of the clad film base material be smaller than 1.55 (even preferably, smaller than 1.53). It is also preferable that the clad film base material be flexible.

Examples of the alicyclic acrylic resin film are OZ-1000 and OZ-1100 (manufactured by Hitachi Chemical Co., Ltd.) in which an aliphatic cyclic hydrocarbon such as tricyclodecane is introduced in an ester substituent.

Examples of the alicyclic olefin resin film is one having a norbornene structure in the main chain and one having a norbornene structure in the main chain and a polar group such as an alkyloxycarbonyl group (alkyl group: an alkyl group having one to six carbons or a cycloalkyl group) in a side chain. The alicyclic olefin resin having a norbornene structure in the main chain and a polar group such as an alkyloxycarbonyl group in a side chain is particularly suitable for manufacture of optical waveguide sheets according to the invention because it exhibits a small refractive index (around 1.50; a large core/clad refractive index difference can be secured) and superior optical characteristics such as high transmittance and is superior in the heat resistance and the adhesion to a mold.

The thickness of the clad film base material is selected taking the flexibility, the rigidity, the ease of handling, etc. into consideration. In general, it is preferable that the thickness of the clad film base material be in a range of 0.1 to 0.5 mm.

3) Step of filling the recesses of the mold with a core formation curable resin by filling, with the core formation curable resin, the through-hole located at one end of each recess of the mold with which the clad film base material is in close contact and then low-pressure-sucking the core formation curable resin from the side of the through-hole located at the other end of each recess of the mold.

In this step, the spaces (the recesses of the mold) formed between the mold and the clad film base material are filled with the core formation curable resin by filling the resin-input-side through-holes with the core formation curable resin and then low-pressure-sucking the core formation curable resin from the side of the resin-ejection-side through-holes. The vacuum suction improves the adhesion between the mold and the clad film base material and thereby prevents mixing of bubbles. For example, the vacuum suction is performed by inserting suction pipes into the resin-ejection-side through-holes and connecting the suction pipes to a pump.

Examples of the core formation curable resin are radiation curable resins, electron beam curable resins, ultraviolet curable resins, and thermosetting resins. Among those resins, ultraviolet curable resins and thermosetting resins are preferable.

Preferable examples of the core formation ultraviolet curable resin and thermosetting resin are ultraviolet curable or thermosetting monomers, oligomers, and mixtures of such a monomer and oligomer.

Preferable examples of the ultraviolet curable resin are epoxy, polyimide, and acrylic ultraviolet curable resins.

The core formation curable resin is introduced into the spaces (the recesses of the mold) formed between the mold and the clad film base material by the capillary phenomenon. The core formation curable resin is required to have sufficiently low viscosity to allow occurrence of this phenomenon. That is, the viscosity of the core formation curable resin should be in a range of 10 to 2,000 mPa·s, preferably in a range of 20 to 1,000 mPa·s, and even preferably in a range of 30 to 500 mPa·s.

Further, to reproduce, with high accuracy, the original shapes of the projections that are formed in the original plate and correspond to optical waveguide cores, the core formation curable resin is required to have a small volume variation due to curing. For example, an undue volume reduction causes a guiding loss. It is therefore desirable that the core formation curable resin has as small a volume variation as possible. It is preferable that the volume variation be smaller than or equal to 10% (even preferably, smaller than or equal to 6%). Lowering the viscosity using a solvent should be avoided if possible, because it causes a large volume variation due to curing.

To decrease the volume variation (i.e., shrinkage) of the core formation curable resin due to curing, a polymer may be added to it. It is preferable that the polymer be compatible with the core formation curable resin and not adversely affect the refractive index, the coefficient of elasticity, and the transmission characteristic of the latter. In addition to decreasing the volume variation of the core formation curable resin, adding a polymer makes it possible to control the viscosity and the glass transition point of the core formation curable resin in a sophisticated manner. Examples of the polymer are acrylic polymers, methacrylic polymers, and epoxy polymers. However, the polymer used in the invention is not limited to these examples.

After being cured, the core formation curable resin needs to be larger in refractive index than the clad film base material (including a clad layer to be formed in the following step 5)). It is preferable that the refractive index be larger than or equal to 1.50 (more preferably, larger than or equal to 1.53). The difference in refractive index between the cores and the clad (including the clad layer to be formed in the following step 5)) should be larger than or equal to 0.01, preferably larger than or equal to 0.03.

4) Step of curing the core formation curable resin that fills the recesses and peeling the mold off the clad film base material.

In this step, the core formation curable resin that fills the recesses is cured. To cure an ultraviolet curable resin, an ultraviolet lamp, ultraviolet LEDs, an ultraviolet illumination device, or the like is used. A thermosetting resin is cured by, for example, heating in an oven.

The mold that is manufactured or used in the steps 1)–3) can be used as a clad layer as it is as long as it satisfies conditions such as a refractive index condition. In this case, the mold need not be peeled off and can be used as a clad layer as it is. In this case, to improve the adhesion between the mold and the core material, it is preferable that the mold be subjected to ozone treatment.

5) Step of forming a clad layer on the clad film base material on which the cores are formed.

In this step, a clad layer is formed on the clad film base material on which the cores are formed. Examples of the clad layer are a film (e.g., a clad film base material as used in the above step 2)), a layer formed by applying and curing a clad curable resin, and a polymer film obtained by applying and drying a solution of a polymer material. Preferable examples of the clad curable resin are ultraviolet curable resins and thermosetting resins, for example, are ultraviolet curable or thermosetting monomers, oligomers, and mixtures of such a monomer and oligomer.

To decrease the volume variation (i.e., shrinkage) of the clad curable resin due to curing, a polymer (e.g., a methacrylic polymer or an epoxy polymer) that is compatible with the resin and does not adversely affect the refractive index, the coefficient of elasticity, and the transmission characteristic of the resin may be added to the resin.

Where a film is used as the clad layer, it is bonded with an adhesive. In this case, it is desirable that the refractive index of the adhesive be close to that of the film. It is preferable that the adhesive used be an ultraviolet curable resin or a thermosetting resin, for example, an ultraviolet curable or thermosetting monomer or oligomer or a mixture of such a monomer and oligomer.

To decrease the volume variation (i.e., shrinkage) of the ultraviolet curable resins or thermosetting resin due to curing, the same polymer as in the clad layer may be added.

To secure a sufficient difference in refractive index from the cores, the refractive index of the clad layer should be smaller than or equal to 1.55, preferably smaller than or equal to 1.53. From the viewpoint of light confinement, it is preferable that the refractive index of the clad layer be equal to that of the clad film base material.

The above-described manufacturing method of a polymeric optical waveguide film is based on the finding that if, as described above, a flexible clad film base material exhibiting good adhesion to a mold is brought into close contact with the mold, no space is formed between the mold and the clad film base material other than recesses of the mold even if no special means is used for fixing those to each other and a core formation curable resin can be introduced into only the recesses. This manufacturing method simplifies the manufacturing process very much and makes it possible to manufacture a polymeric optical waveguide film easily, thereby making it possible to manufacture a polymeric optical waveguide film at a much lower cost than conventional manufacturing methods of a polymeric optical waveguide film. In the above-described manufacturing method of a polymeric optical waveguide film, through-holes are formed through the mold and a core formation curable resin is low-pressure-sucked from the side of the resin-ejection-side through-hole of each recess of the mold. This further improves the adhesion between the mold and the clad film base material and prevents mixing of bubbles. Further, although the above-described manufacturing method is simple, polymer optical waveguide films manufactured by that method are low in guiding loss and highly accurate and can be mounted freely in various apparatus.

A guided light leakage portion is provided in the core lower surface(s) (denoted by symbol 14C in FIG. 1A) and/or the upper surface (denoted by symbol 12C in FIG. 1A) of the lower clad of the polymeric optical waveguide film. The core lower surface means the surface(s) of the core(s) that is in contact with the lower clad. The upper surface of the lower clad means the surface of the lower clad that is in contact with the core(s).

A guided light leakage portion to be provided in the upper surface of the lower clad is an optical defect portion and is formed by, for example, forming a cut (depth: 1 μm to the thickness of the lower clad (i.e., formation of a through-hole)) with a dicing saw from above the core forming surface of the lower clad or forming minute asperities (i.e., roughening the surface) with a dicing saw having a blade of a large grain size.

Where the guided light leakage portion is provided in the lower clad, the clad film base material that is used in step 2) of the manufacturing process of a polymeric optical waveguide film becomes the lower clad and hence the guided light leakage portion is provided in the core forming surface of the clad film base material before the execution of step 2).

Where the guided light leakage portion is provided in the core lower surface(s), an optical defect portion is formed in the core upper surface(s) in the same manner as described above after the cores are formed on the clad film base material in the above-described step 4). Therefore, in this case, the clad layer that is formed in the above-described step 5) serves as the "lower clad."

An optical path changing mirror surface can easily be formed at one end of the polymeric optical waveguide film by dicing with an angled blade. To change the optical path by 90°, for example, it is appropriate to perform dicing with a dicing saw having a 45'-angled blade for Si. An alignment surface that is, for example, a vertical surface (i.e., perpendicular to the surfaces of the polymeric optical waveguide film) can be formed by cutting away a tip portion, having a prescribed length, of only the clad with a dicing saw or the like perpendicularly to the longitudinal direction of the polymeric optical waveguide film (see the alignment surface 10b in FIG. 1B).

The invention will be described below in more detail by using Examples. However, the invention is not limited to those Examples.

EXAMPLE 1

This Example is such that a polymeric optical waveguide module as shown in FIGS. 6 and 7A–7D is manufactured.

After a thick resist film (SU-8 of MicroChem Corp.) is applied to a Si substrate by spin coating, it is pre-baked at 80° C., exposed through a photomask, and developed, whereby four projections having a square cross section (50 μm in both width and height and 80 mm in length) are formed. The interval between the adjoining projections is set at 250 μm. The resulting substrate is post-baked at 120° C., whereby an original plate for manufacture of a polymeric optical waveguide is produced.

Then, after a mold release agent is applied to the original plate, a mixture of thermoplastic liquid dimethylsiloxane rubber (SYLGARD 184 of Dow Corning Asia Ltd.; viscosity: 5,000 mPa·s) and the curing agent is poured, cured by heating it at 120° C. for 30 minutes, and is peeled off, whereby a mold (thickness: 5 mm) having recesses corresponding to the projections having the square cross section is produced.

Then, a casting mold is produced by forming, by punching, through-holes at both ends of each recess of the above mold so that each pair of through-holes communicate with the associated recess. The through-hole is circular in a plan view and has a tapered cross section taken parallel with the thickness direction of the casting mold. The through-holes located on the core formation curable resin input side have a diameter of 4 mm at the surface of the mold that is to be brought into contact with a clad film base material and a diameter of 3.5 mm at the opposite surface. The through-holes for low-pressure sucking are the same in size as the resin-input-side through-holes and are tapered in the opposite way.

Subsequently, guided light leakage portions are formed in a 100-μm-thick clad film base material (Arton film of JSR Corp.; refractive index: 1.510; serves as a lower clad) that is one size larger than the mold. This is done by forming 50-μm-deep cuts in the core forming surface of the clad film base material with a dicing saw perpendicularly to the longitudinal direction of four cores to be formed in the next step.

The clad film base material that is formed with the guided light leakage portions is brought into close contact with the thus-produced mold. Then, several droplets of an ultraviolet curable resin (manufactured by JSR Corp.) having a viscosity of 1,300 mPa·s are dropped into each resin-input-side through hole of the mold and the ultraviolet curable resin is low-pressure sucked from the side of the resin-ejection side through-holes, whereby the recesses are filled with the ultraviolet curable resin in 20 minutes. Then, the resin is cured by applying ultraviolet light of 50 mW/cm$^2$ from above the mold for 5 minutes. The mold is peeled off the Arton film and cores having the same shape as the projections of the original plate are formed on the Arton film. The refractive index of the cores is 1.591.

Then, after an ultraviolet curable resin (manufactured by JSR Corp.) that have the same refractive index (1.510) as the Arton film when cured is applied to the core forming surface of the clad film base material, a 100-μm-thick Arton film (manufactured by JSR Corp.; refractive index: 1.510; serves as an upper clad) is bonded to the clad film base material. The resin is cured by illuminating it with ultraviolet light of 50 mW/cm$^2$ for 5 minutes, whereby a 300-μm-thick polymeric optical waveguide film is produced as a bonded body of the two films.

Then, the polymeric optical waveguide sheet is cut perpendicularly to the longitudinal direction of the cores with a dicing saw having a 45'-angled blade for Si, whereby the cores having 45° mirror surfaces are exposed. Then, a tip portion of the clad is cut away vertically, that is, perpendicularly to the longitudinal direction of the polymeric optical waveguide film, whereby a vertical section (denoted by symbol 10b in FIG. 1B) having a height of 50 μm as measured from the bottom is formed. The 45° mirror surface and the vertical alignment surface are thus formed at the same end of the polymeric optical waveguide film.

Then, a through-hole for attachment of a light-emitting element and a through-hole for attachment of a monitoring light-receiving element are formed in a 250-μm-thick Si substrate by RIE. After a 50-μm-deep recess for holding the polymeric optical waveguide film is formed by RIE, one end portion of the thus-processed Si substrate is cut away with a dicer, whereby a Si submount is produced.

Subsequently, Sn—Au solder is interposed between a ceramic IC package, the Si submount, a light-emitting element (4-channel array type with an array interval of 250 μm; manufactured by Fuji Xerox Co., Ltd.), and a monitoring light-receiving element (4-channel array type with an array interval of 250 μm) and is heated at 250° C., whereby the Si submount, the light-emitting element, and the light-receiving element are fixed to the IC package. After the alignment surface of the polymeric optical waveguide film is lightly mated to the alignment surface of the recess of the Si submount, the polymeric optical waveguide film is bonded to the surface of the recess of the Si submount with an ultraviolet curable adhesive. Finally, wiring is performed on the light-emitting element and the light-receiving element with a wire bonder, whereby a polymeric optical waveguide module with the light-emitting element is completed.

In assembling the module, the light-emitting points of the light-emitting element and the optical path changing surface of the polymeric optical waveguide film are correctly aligned with each other merely by lightly mating the alignment surface of the polymeric optical waveguide film to that of the submount. Light beams emitted from the light-emitting element are monitored satisfactorily using light beams that are detected through the guided light leakage portions.

EXAMPLE 2

This Example is such that a polymeric optical waveguide module is manufactured in the same manner as in Example 1 except that guided light leakage portions are formed in the lower surfaces of the cores. After cores are formed on the clad film base material, 5-μm-deep cuts in the guided light leakage portions in the lower surfaces of the cores are formed only in the cores with a dicing saw perpendicularly to the longitudinal direction of the cores. The blade of the dicing saw has a grain size of about 7 μm and the surface is roughened by this blade.

EXAMPLE 3

A polymeric optical waveguide module with a light-emitting element is manufactured in the same manner as in Example 1 except that the light-emitting element is changed to a GaAs photodiode. Results are similar to the results of Example 1.

EXAMPLE 4

A polymeric optical waveguide module with a light-emitting element is manufactured in the same manner as in Example 1 except that a glass submount is used.

EXAMPLE 5

A polymeric optical waveguide module with a light-emitting element is manufactured in the same manner as in Example 2 except that a glass submount is used.

As described above, according to an aspect of the present invention, a polymeric optical waveguide module includes: a light-emitting element; a polymeric optical waveguide film having a lower clad, a core, an upper clad, an optical path changing mirror surface provided at one end of the polymeric optical waveguide film and a guided light leakage portion on at least one of a lower surface of the core and an upper surface of the lower clad; and a monitoring light-receiving element that monitors light emitted from the light-emitting element. The light-emitting element, the polymeric optical waveguide film and the monitoring light-receiving element are aligned with each other so that the light emitted from the light-emitting element is reflected by the optical path changing mirror surface to be guided through the core and part of the light emitted from the light-emitting element is received by the monitoring light-receiving element via the guided light leakage portion.

The light-emitting element, the polymeric optical waveguide film and the monitoring light-receiving element may be held on a submount.

In the polymeric optical waveguide module, an alignment surface may be formed at the same end of the polymeric optical waveguide film as the optical path changing mirror surface is formed, and the submount may have an alignment surface corresponding to the alignment surface of the polymeric optical waveguide film.

The optical path changing mirror surface may be a 45° mirror surface.

The alignment surfaces of the polymeric optical waveguide film and the submount may be vertical surfaces.

The optical path changing mirror surface and the alignment surface of the polymeric optical waveguide film may be formed by cutting away one of end portions of the polymeric optical waveguide film.

The 45° mirror surface may be formed by cutting the polymeric optical waveguide film with a 45'-angled blade.

The submount may have respective through-holes that hold the light-emitting element and the monitoring light-receiving element and a recess that holds the polymeric optical waveguide film.

The submount may be made of a Si substrate or glass.

The guided light leakage portion may be a cut that is formed on at least one of the lower surface of the core and the upper surface of the lower clad with a dicing saw.

At least one of the lower clad and the upper clad of the polymeric optical waveguide film may be a flexible alicyclic olefin resin film which may have a norbornene structure in a main chain and a polar group in a side chain.

The polymeric optical waveguide film may be bonded to one of the light-emitting element and the monitoring light-receiving element with an adhesive. The adhesive may be the same as a clad material of the polymeric optical waveguide film. The adhesive may be a thermosetting adhesive or ultraviolet curable adhesive whose volumetric shrinkage is not more than 10%.

The polymeric optical waveguide module may further have a connector that is connected to an end surface of the polymeric optical waveguide film. The surface is opposite to the other end surface where the optical path changing mirror surface is formed.

According to another aspect of the present invention, a polymeric optical waveguide film have: a lower clad; a core; an upper clad; an optical path changing mirror surface located at one end portion of the polymeric optical waveguide film; and a guided light leakage portion on at least one of a lower surface of the core and an upper surface of the lower clad.

According to another aspect of the present invention, a method of manufacturing a polymeric optical waveguide film includes: forming a core on a base material for forming a clad by the steps of bringing the base material into close contact with a mold made of a cured layer of a mold-forming curable resin, the mold having a recess corresponding to an optical waveguide core projection and at least two through-holes that communicate with respective ends of the recess, filling the recess of the mold with a core-forming curable resin by filling, with the core-forming curable resin, one of the through-holes located at an end of the recess of the mold with which the base material is in close contact, performing vacuum suction of the core-forming curable resin from the other through-hole located at the other end of the recess, and curing the core-forming curable resin that fills the recess and peeling the mold off the base material; and forming a clad layer on the base material on which the core is formed.

According to the embodiments of the invention, the output power of the light-emitting element can be monitored merely by disposing the polymeric optical waveguide film provided with a guided light leakage portion between the light-emitting element and the monitoring light-receiving element for monitoring the output power of the light-emitting element. It is unnecessary to perform the alignment of a microlens, which is necessary in conventional techniques. In the polymeric optical waveguide module, the optical path of light emitted from the light-emitting element is changed by the optical path changing mirror surface that is provided in the polymeric optical waveguide film; it is not necessary to use any special mirror, lens, or the like. Therefore, the polymeric optical waveguide module according to the embodiments of the invention can be implemented easily, has a simple structure, and can be manufactured at a very low cost. A very compact module can be implemented.

The polymeric optical waveguide film itself that is used in the polymeric optical waveguide module can be manufactured by a simple method. The number of steps that are needed additionally to form the guided light leakage portion is reduced to a minimum. Therefore, the polymeric optical waveguide film can also be manufactured at a low cost.

Where the polymeric optical waveguide film has plural waveguide cores, monitoring light can be taken out of each core independently, that is, without affecting light beams guided through the other cores. Monitoring light from each core correctly reflects the power at the light-emitting point and hence the monitoring enables correct feedback. As a result, light beams having uniform output power can be output from the ends of the cores.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

The entire disclosure of Japanese Patent Application No. 2004-190984 filed on Jun. 29, 2004 including specification, claims, drawings and abstract is incorporated herein by reference in its entirety.

What is claimed is:

1. A polymeric optical waveguide module comprising:
    a submount, the submount including a first through-hole disposed at an end portion of the submount and a second through-hole disposed along a side portion of the submount;
    a light-emitting element disposed in the first through-hole;
    a polymeric optical waveguide film having a lower clad, a core, an upper clad, an optical path changing mirror surface provided at one end of the polymeric optical waveguide film and a guided light leakage portion on at least one of a lower surface of the core and an upper surface of the lower clad; and
    a monitoring light-receiving element disposed in the second through-hole, the monitor light-receiving element monitoring light emitted from the light-emitting element,
    wherein the light-emitting element, the polymeric optical waveguide film and the monitoring light-receiving element are aligned with each other by the submount so that the light emitted from the light-emitting element is reflected by the optical path changing mirror surface to be guided through the core and part of the light emitted from the light-emitting element is received by the monitoring light-receiving element via the guided light leakage portion.

2. The polymeric optical waveguide module according to claim 1, wherein the light-emitting element, the polymeric optical waveguide film and the monitoring light-receiving element are held by the submount.

3. The polymeric optical waveguide module according to claim 2, wherein a first alignment surface is formed at the same end of the polymeric optical waveguide film as the optical path changing mirror surface is formed, and wherein the submount has a second alignment surface corresponding to the first alignment surface of the polymeric optical waveguide film.

4. The polymeric optical waveguide module according to claim 1, wherein the optical path changing mirror surface is a 45° mirror surface.

5. The polymeric optical waveguide module according to claim 3, wherein the first alignment surface of the polymeric optical waveguide film and the second alignment surface of the submount are vertical surfaces.

6. The polymeric optical waveguide module according to claim 3, wherein the optical path changing mirror surface and the first alignment surface of the polymeric optical waveguide film are formed by cutting away one of end portions of the polymeric optical waveguide film.

7. The polymeric optical waveguide module according to claim 4, wherein the 45° mirror surface is formed by cutting the polymeric optical waveguide film with a 45°-angled blade.

8. The polymeric optical waveguide module according to claim 2, wherein the submount has a recess that holds the polymeric optical waveguide film.

9. The polymeric optical waveguide module according to claim 2, wherein the submount is made of a Si substrate.

10. The polymeric optical waveguide module according to claim 2, wherein the submount is made of glass.

11. The polymeric optical waveguide module according to claim 1, wherein the guided light leakage portion is a cut that is formed on at least one of the lower surface of the core and the upper surface of the lower clad with a dicing saw.

12. The polymeric optical waveguide module according to claim 1, wherein at least one of the lower clad and the upper clad of the polymeric optical waveguide film is a flexible alicyclic olefin resin film.

13. The polymeric optical waveguide module according to claim 12, wherein the alicyclic olefin resin film is a resin film having a norbornene structure in a main chain and a polar group in a side chain.

14. The polymeric optical waveguide module according to claim 1, wherein the polymeric optical waveguide film is bonded to one of the light-emitting element and the monitoring light-receiving element with an adhesive.

15. The polymeric optical waveguide module according to claim 14, wherein the adhesive is the same as a clad material of the polymeric optical waveguide film.

16. The polymeric optical waveguide module according to claim 14, wherein the adhesive is a thermosetting adhesive whose volumetric shrinkage is not more than 10%.

17. The polymeric optical waveguide module according to claim 14, wherein the adhesive is a ultraviolet curable adhesive whose volumetric shrinkage is not more than 10%.

18. The polymeric optical waveguide module according to claim 1, further comprising:
a connector that is connected to an end surface of the polymeric optical waveguide film, the end surface being opposite to another end surface of the polymeric optical waveguide film where the optical path changing mirror surface is formed.

* * * * *